United States Patent
Kim et al.

(10) Patent No.: US 9,294,855 B2
(45) Date of Patent: Mar. 22, 2016

(54) APPARATUS AND METHOD FOR PROCESSING AUDIO SIGNAL

(71) Applicant: SAMSUNG ELECTRONICS CO., LTD., Suwon-si (KR)

(72) Inventors: Jong-woo Kim, Yongin-si (KR); Jong-kyu Lee, Seoul (KR); Byung-soo Kim, Seoul (KR); Kee-yeong Cho, Seongnam-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 262 days.

(21) Appl. No.: 14/146,298

(22) Filed: Jan. 2, 2014

(65) Prior Publication Data

US 2014/0185816 A1  Jul. 3, 2014

Related U.S. Application Data

(60) Provisional application No. 61/748,552, filed on Jan. 3, 2013, provisional application No. 61/748,255, filed on Jan. 2, 2013.

(30) Foreign Application Priority Data

May 3, 2013 (KR) ........................ 10-2013-0050266

(51) Int. Cl.
*H04R 29/00* (2006.01)
*H03G 3/30* (2006.01)

(52) U.S. Cl.
CPC ............. *H04R 29/00* (2013.01); *H03G 3/3005* (2013.01)

(58) Field of Classification Search
USPC ............... 381/2–16, 57, 58, 61, 98, 104, 106, 381/107, 109; 84/386, 422.1, 627, 659, 84/660–662, 667
See application file for complete search history.

(56) References Cited

U.S. PATENT DOCUMENTS

| | | | | |
|---|---|---|---|---|
| 6,121,533 A | * | 9/2000 | Kay | G10H 1/0091 84/616 |
| 6,433,267 B2 | * | 8/2002 | Park | 84/611 |
| 6,442,275 B1 | * | 8/2002 | Diethorn | H04M 9/082 379/406.01 |
| 6,542,869 B1 | * | 4/2003 | Foote | G06F 17/30743 704/200.1 |
| 6,965,069 B2 | * | 11/2005 | Le-Faucheur | G10H 7/02 84/622 |
| 6,993,126 B1 | * | 1/2006 | Kyrylenko | H04M 9/08 379/388.06 |
| 8,275,152 B2 | | 9/2012 | Smirnov et al. | |
| 2005/0018862 A1 | * | 1/2005 | Fisher | H03G 7/007 381/98 |
| 2006/0239473 A1 | * | 10/2006 | Kjorling | H04S 5/005 381/98 |
| 2007/0255739 A1 | * | 11/2007 | Miyajima | G10H 1/40 |
| 2009/0074209 A1 | * | 3/2009 | Thompson | H03G 9/005 381/107 |
| 2010/0158259 A1 | | 6/2010 | Hanna et al. | |
| 2011/0280407 A1 | | 11/2011 | Skinner et al. | |

\* cited by examiner

*Primary Examiner* — Vivian Chin
*Assistant Examiner* — Friedrich W Fahnert
(74) *Attorney, Agent, or Firm* — Sughrue Mion, PLLC

(57) ABSTRACT

An audio signal processing apparatus and method for processing an audio signal are provided. The audio signal processing apparatus includes a signal detector configured to detect a long-term envelope and a short-term envelope of a lower range signal of an input signal, and a controller configured to control a gain in a beat section of the input signal, wherein the beat section is determined based on the detected long-term envelope and the short-term envelope of the lower range signal.

31 Claims, 18 Drawing Sheets

APPARATUS AND METHOD FOR PROCESSING AUDIO SIGNAL

CROSS-REFERENCE TO RELATED APPLICATIONS

This application claims the benefit of U.S. Provisional Application No. 61/748,255, filed on Jan. 2, 2013, and U.S. Provisional Application No. 61/748,552, filed on Jan. 3, 2013, in the U.S. Patent and Trademark Office, and priority from Korean Patent Application No. 10-2013-0050266, filed on May 3, 2013 in the Korean Intellectual Property Office, the disclosures of which are incorporated herein by reference in their entireties.

BACKGROUND

1. Field

Apparatuses and methods consistent with exemplary embodiments relate to an apparatus and method for processing an audio signal, and more particularly, to an audio signal processing apparatus which controls a gain of an input signal and an audio signal processing method thereof.

2. Description of the Related Art

As the utilization of a television (TV), a home theater, a tablet personal computer (PC), a mobile phone and the like has increased along with the consumption of digital media on those devices, a demand for more vivid sound in movie, music, etc. has been gradually increased.

For example, a lower frequency range includes a component that makes a listener feel a sensation of beating, and it is therefore possible to reinforce a rhythmical sense a listener feels by controlling a gain corresponding to a dynamic characteristic of a lower range sound.

FIG. 1 shows an example of a sound width expanding apparatus (hereinafter, referred to as an 'expander') that reinforces the lower range sound in accordance with the related art.

As shown in FIG. 1, the expander for reinforcing the lower range sound adjusts an output level by monitoring a level of an input signal with respect to a preset threshold and generating a gain control signal. Accordingly, if the level of the whole input signals gets out of a range detectable by the preset threshold, no operation may be performed. Further, the output level is adjusted as much as a preset expanding ratio, there may be a misoperation where the adjustment of the level is too high or too low.

For this reason, the related art expander for reinforcing the lower range sound has been mostly operated in such a manner that an acoustic expert directly sets up a gain value in accordance with characteristics of the input sound. Thus, it is general that the related art expander is used when creating music, that is, at sound mixing.

An extreme low frequency signal having no effect on tone color may be added to a sound signal so as to reinforce the sensation of the lower range in accordance with the related art.

FIG. 2 shows an example of a sound width expanding apparatus that adds the extreme low frequency signal in accordance with the related art.

As shown in FIG. 2, a related art expander for adding the extreme low frequency signal is realized in such a manner that a proper amount of extreme low frequency signal is added to a necessary section under an expert's precise control during the sound mixing.

Accordingly, most of sound mixing for reinforcing the lower range sound or adding the extreme low frequency signal is manually performed by an acoustic expert because it often needs experiences and techniques. Further, it may be is difficult for an ordinary listener to apply any manual adding to completely mixed content and apply any manual adding to practical appreciation such as a movie or music.

SUMMARY

According to an aspect of an exemplary embodiment, there is provided an audio signal processing apparatus including a signal detector configured to detect a long-term envelope and a short-term envelope of a lower range signal of an input signal, and a controller configured to control a gain in a beat section of the input signal, wherein the beat section is determined based on the detected long-term envelope and the short-term envelope of the lower range signal.

The signal detector may be further configured to use attack and release sections of the lower range signal to detect the long-term envelope and the short-term envelope.

The signal detector may include a first comparator configured to output a level variation of the lower range signal based on an amplitude ratio between the long-term envelope and the short-term envelope of the lower range signal.

The gain controller may be further configured to control the gain of the beat section in accordance with the amplitude ratio, based on the received level variation.

The gain controller may be further configured to generate a gain control signal so that the gain becomes larger as difference in level between the long-term envelope and the short-term envelope of the lower range signal decreases.

The gain controller may be further configured to apply the gain control signal to at least one of the input signal and the lower range signal.

A threshold for determining whether to control the gain of the input signal may be varied based on the level variation.

The signal detector may be further configured to detect a long-term envelope of a full range signal of the input signal.

The gain controller may be further configured to control the gain of the beat section by adding an extreme low frequency signal to the beat section of the input signal, and wherein the extreme low frequency signal may correspond to a short-term envelope value of the lower range signal.

The audio signal processing apparatus may further include an extreme low frequency signal generator configured to generate an extreme low frequency signal, wherein the gain controller may be configured to generate a gain control signal for determining an amount of the extreme low frequency signal to add into the beat section to correspond to the short-term envelope value of the lower range signal, and add the gain control signal and the generated extreme low frequency signal together.

The gain controller may be further configured to add the added extreme low frequency signal and the gain control signal to at least one of the input signal and the lower range signal.

The signal detector may include a second comparator that is configured to compare the long-term envelope and the short-term envelope of the lower range signal with the long-term envelope of the full range signal with respect to amplitude, and output on/off signals to determine the beat section.

The gain controller may be configured to determine that a section is the beat section if an amplitude ratio between the short-term envelope and the long-term envelope of the lower range signal is larger than or equal to a preset ratio, in accordance with an output signal of the second comparator.

The gain controller may be configured to determine that a section is the beat section if an amplitude of the long-term envelope of the lower range signal is larger than or equal to a preset ratio, in accordance with an output signal of the second comparator.

The audio signal processing apparatus may further including a low pass filter configured to separate out the lower range signal from a full range input signal.

According to an aspect of another exemplary embodiment, there is provided an audio signal processing method including detecting a long-term envelope and a short-term envelope of a lower range signal of an input signal, controlling a gain in a beat section of the input signal, and determining the beat section based on the detected long-term envelope and the short-term envelope of the lower range signal.

The detecting may include using attack and release sections of the lower range signal to detect the long-term envelope and the short-term envelope.

The audio signal processing method may further include outputting a level variation of the lower range signal based on an amplitude ratio between the long-term envelope and the short-term envelope of the lower range signal.

The controlling the gain may include controlling the gain of the beat section in accordance with the amplitude ratio, based on the received level variation.

The controlling the gain may include generating a gain control signal so that the gain becomes larger as difference in level between the long-term envelope and the short-term envelope of the lower range signal decreases.

The audio signal processing method may further include applying the gain control signal to at least one of the input signal and the lower range signal.

A threshold for determining whether to control the gain of the input signal may be varied based on the level variation.

The audio signal processing method may further include detecting a long-term envelope of a full range signal of the input signal.

The controlling the gain may include controlling the gain of the beat section by adding an extreme low frequency signal to the beat section of the input signal, and wherein the extreme low frequency signal may correspond to a short-term envelope value of the lower range signal.

The audio signal processing method may further include generating an extreme low frequency signal, wherein the controlling the gain may include generating a gain control signal for determining an amount of the extreme low frequency signal to add into the beat section to correspond to the short-term envelope value of the lower range signal, and adding the gain control signal and the generated extreme low frequency signal together.

The audio signal processing method may further include adding the added extreme low frequency signal and the gain control signal to at least one of the input signal and the lower range signal.

The audio signal processing method may further include comparing the long-term envelope and the short-term envelope of the lower range signal with the long-term envelope of the full range signal with respect to amplitude; and outputting on/off signals to determine the beat section.

The audio signal processing method may further include determining that a section is the beat section if an amplitude ratio between the short-term envelope and the long-term envelop of the lower range signal is larger than or equal to a preset ratio, in accordance with an output signal of the comparator.

The audio signal processing method may further include determining that a section is the beat section if an amplitude of the long-term envelope of the lower range signal is larger than or equal to a preset ratio, in accordance with an output signal of the comparator.

The audio signal processing method may further include separating out the lower range signal through a low pass filter.

BRIEF DESCRIPTION OF THE DRAWINGS

The above and/or other aspects will become apparent and more readily appreciated from the following description of exemplary embodiments, taken in conjunction with the accompanying drawings, in which.

DETAILED DESCRIPTION OF EXEMPLARY EMBODIMENTS

Below, exemplary embodiments will be described in detail with reference to accompanying drawings.

This exemplary embodiment relates to an audio signal processing apparatus. The audio processing apparatus in these embodiments may be achieved by a sound width expanding apparatus (hereinafter, referred to as an 'expander') which reinforces a lower range sound or adds an extreme low frequency signal to an input audio signal.

The audio signal processing apparatus in this embodiment detects a long-term envelope and a short-term envelope from a lower range signal (i.e., a low frequency signal or a bass signal) of an input signal, and uses the detected long-term envelope and short-term envelope of the lower range signal, thereby generating a gain control signal for controlling a gain of a beat section of the input signal. Such a generated gain control signal is applied to an original input signal and output as an output audio signal so that a listener can listen sound reinforced with a rhythmical sense or having a more dynamical sensation of beating.

Figure 1:
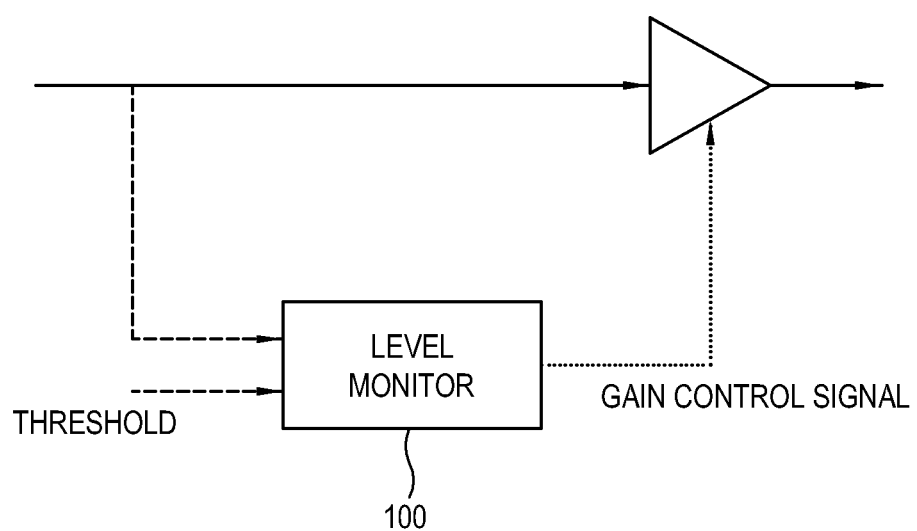
FIG. 1 shows an example of a sound width expanding apparatus where a lower range sound is reinforced according to the related art.
Figure 2:
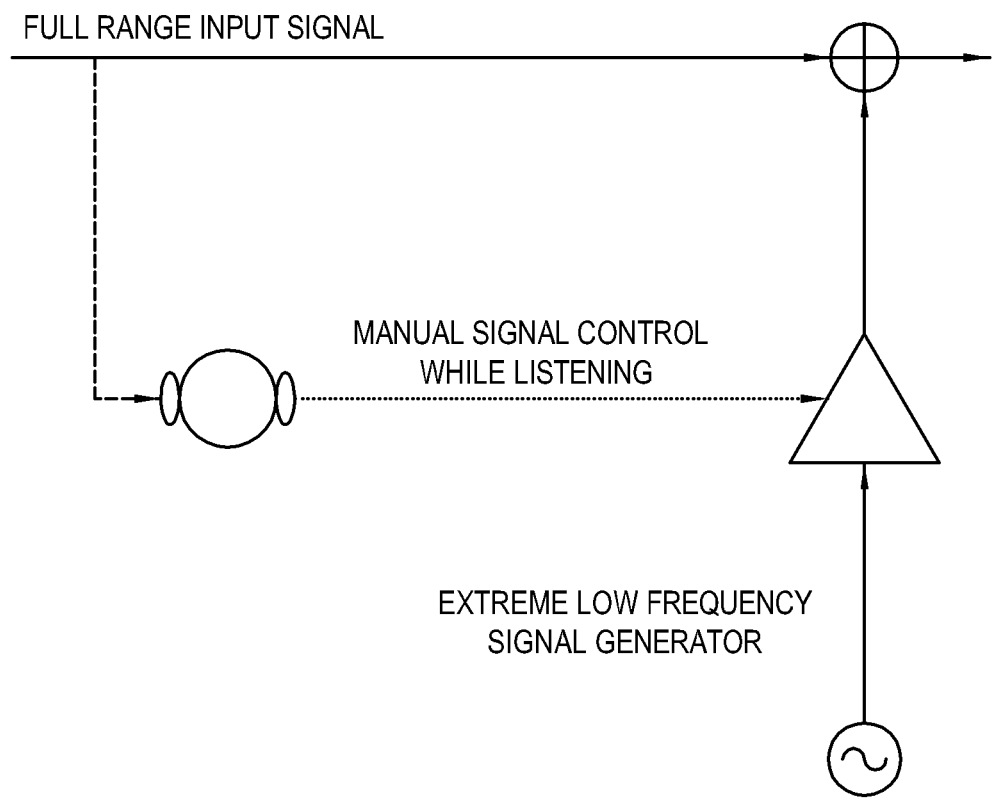
FIG. 2 shows an example of a sound width expanding apparatus where an extreme low frequency signal is added according to the related art.
Figure 3:
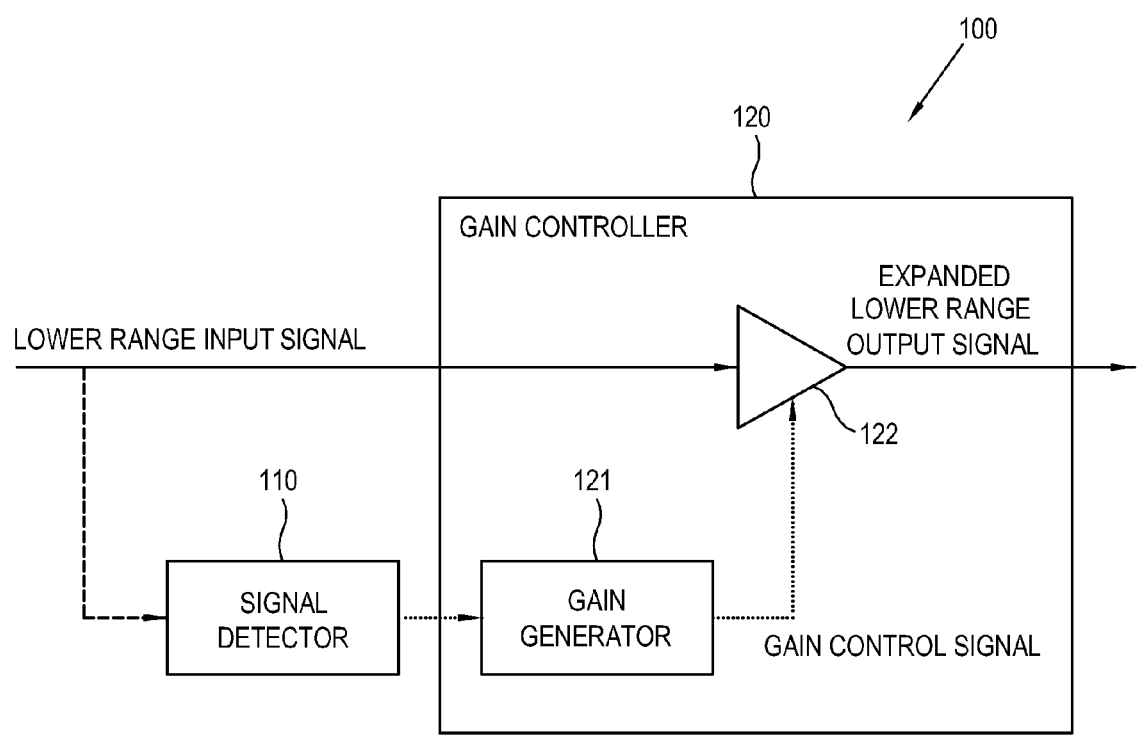
FIG. 3 is a block diagram showing configurations of an audio signal processing apparatus according to a first exemplary embodiment.
Figure 4:
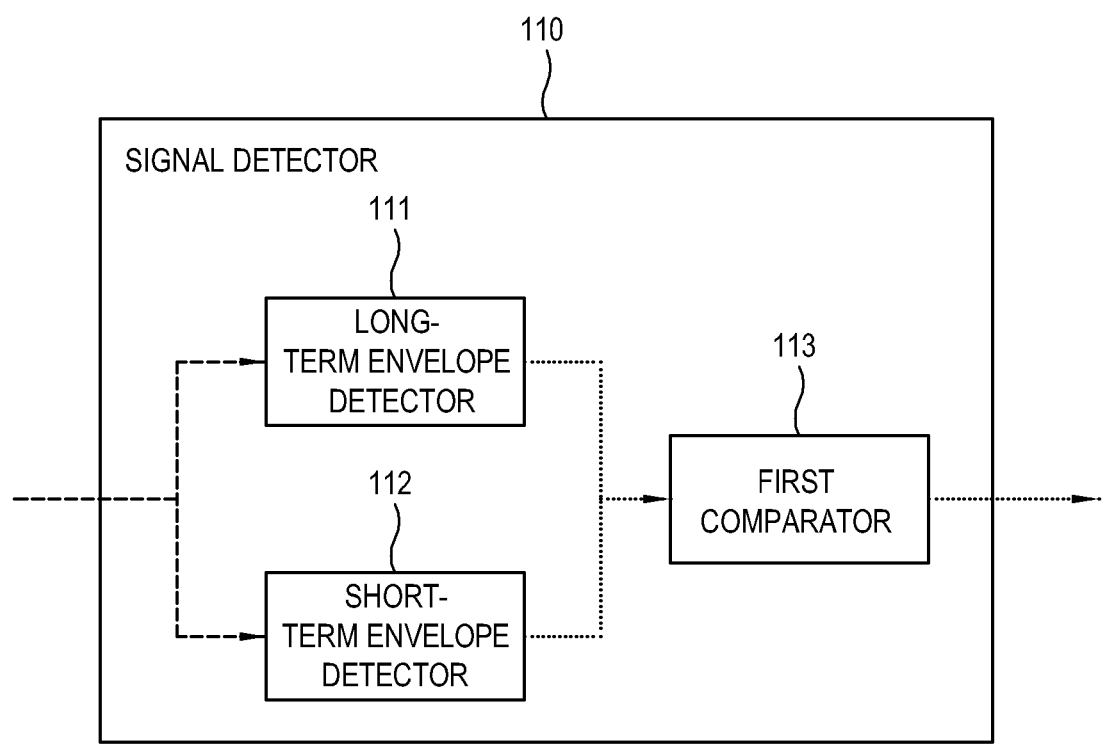
FIG. 4 is a block diagram showing configurations of a signal detector of FIG. 3.

FIG. 3 is a block diagram showing configurations of an audio signal processing apparatus 100 according to a first exemplary embodiment, and FIG. 4 is a block diagram showing configurations of a signal detector 110 of FIG. 3;

As shown in FIG. 3, the audio signal processing apparatus 100, according to the first exemplary embodiment includes the signal detector 110 which detects a level variation from the lower range signal of the input signal, and a gain controller 120 which controls a gain of the input signal based on the level variation detected in the signal detector 110. In the first exemplary embodiment shown in FIG. 3, the signal detector 110 of the audio signal processing apparatus 100 receives a previously divided lower range signal, but is not limited thereto. Alternatively, a low pass filter (LPF) may be additionally provided to divide the lower range signal from a full range input signal. The low pass filter may be included in the signal detector 110, or provided as a separate element of the audio signal processing apparatus 100.

As shown in FIG. 4, the signal detector 110 includes a long-term envelope detector 111 for detecting the long-term envelope of the lower range signal; a short-term envelope detector 112 for detecting the short-term envelope of the lower range signal; and a first comparator 113 for outputting a level variation in the lower range signal in accordance with amplitude ratios between the long-term envelope and the short-term envelope of the lower range signal.

The long-term envelope detector 111 and the short-term envelope detector 112 use an attack section and a release section of the lower range signal to detect the long-term envelope and the short-term envelope, respectively. The attack section corresponds to a section from a starting point of sound to a maximum level point, which is shown as a short section in FIGS. 5 and 6. The release section corresponds to a section where the sound gets smaller and disappears, which is shown as a long section as shown in FIGS. 5 and 6.

Figure 5:
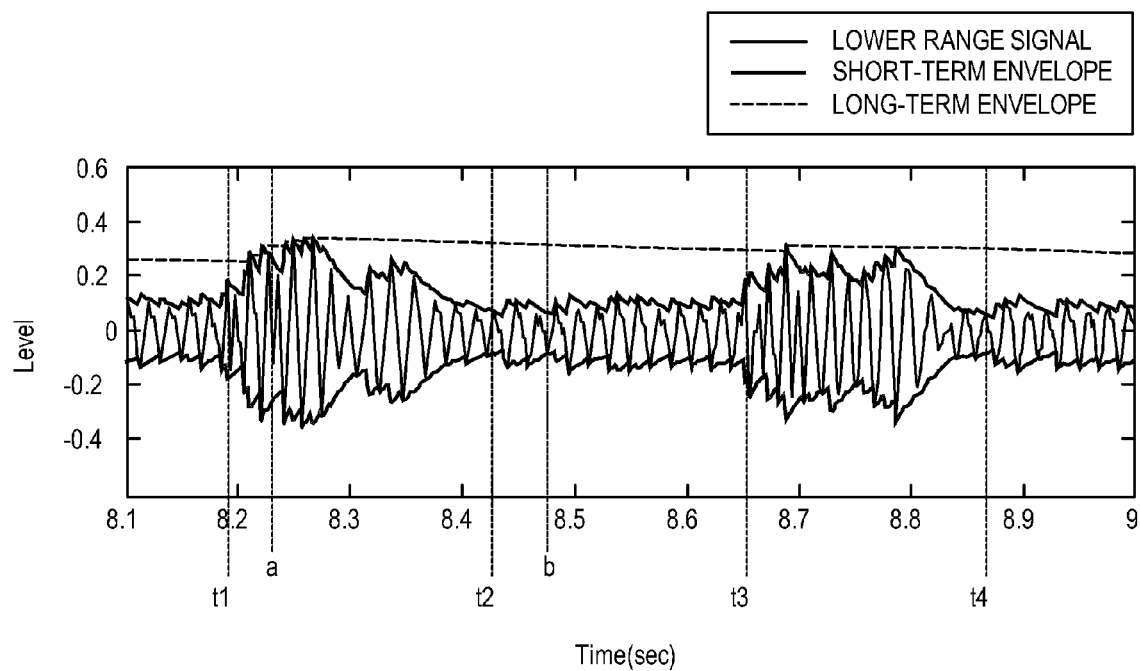
FIGS. 5 and 6 show waveforms of audio signals according to the first exemplary embodiment.
Figure 6:
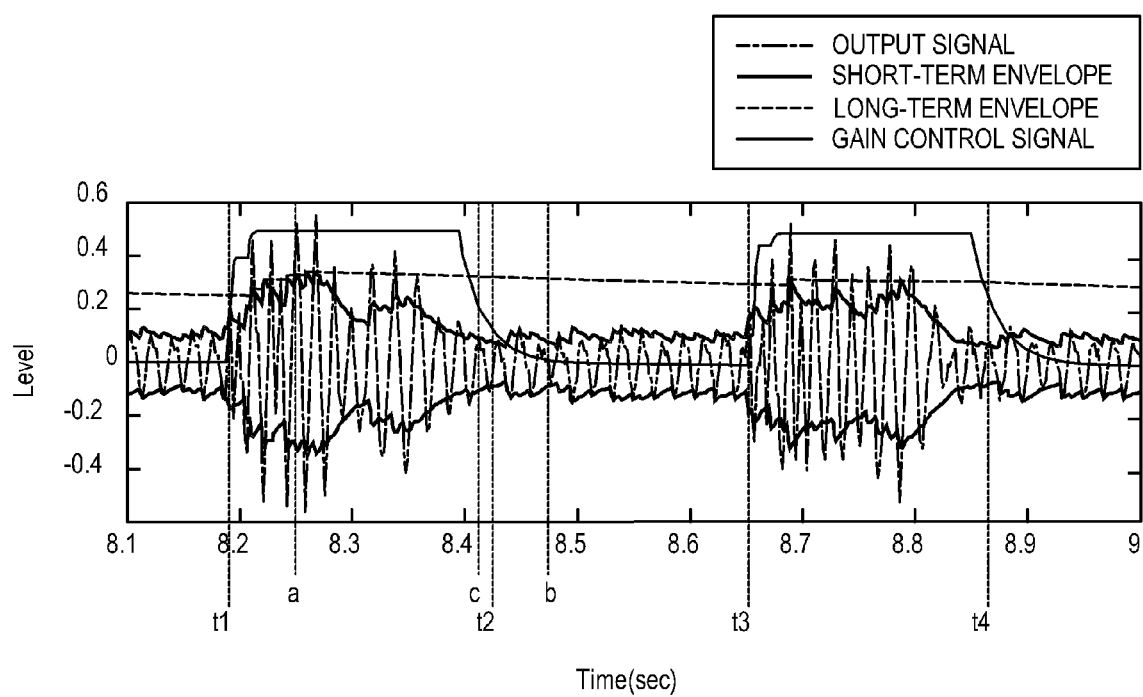

FIGS. 5 and 6 show waveforms of audio signals according to the first exemplary embodiment. FIG. 5 shows respective waveforms of a lower range input signal, and a long-term envelope and a short-term envelope of the lower range signal, and FIG. 6 shows respective waveforms of a lower range output signal, a long-term envelope and a short-term envelope of the lower range signal, and a gain control signal.

An output value of the first comparator 113, as shown in FIG. 4, refers to a level variation in the lower range signal as a ratio between the long-term envelope and the short-term envelope of the lower range signal, and the value is transmitted to the gain controller 120, as shown in FIG. 3. Referring to FIG. 5, the higher the level variation in the lower range signal, the smaller the difference between the long-term envelope and the short-term envelope may be.

Thus, the first comparator 113, as shown in FIG. 4, in this exemplary embodiment is provided to increase the output value, i.e., the level variation corresponding to the ratio as a difference in amplitude between the long-term envelope and the short-term envelope of the lower range signal becomes smaller. For example, in FIG. 5, the level variation at a point of time 'a' where the long-term envelope and the short-term envelope have a small difference in amplitude which is a smaller comparative difference as compared to a point of time 'b' where the long-term envelope and the short-term envelope are largely different in amplitude. Accordingly, the output value of the first comparator 113 at the point of time 'a' is greater than that at the point of time 'b'.

As shown in FIG. 3, the gain controller 120 may include a gain generator 121 which generates a gain control signal based on the level variation received from the signal detector 110. The gain controller 120 also may include a first signal multiplexer 122 which outputs a lower range output signal extended by the generated gain control signal received from the gain generator 121. For instance, FIG. 3 illustrates that the first signal multiplexer 122 applies gain control to the lower range signal, but not limited thereto. Alternatively, the audio signal processing apparatus 100 may apply gain control to a full range signal.

If the ratio between the long-term and short-term envelopes received from the signal detector 110, i.e., the level variation increases, the gain generator 121 determines this section as a beat section where there are beats, and generates a gain control signal having a positive correlation so as to correspond to the received ratio. Thus, the gain generator 121 generates the gain control signal in order to increase the gain when the difference in level between the long-term envelope and the short-term envelope of the lower range signal is small.

According to the first exemplary embodiment, the beat section to which the gain control signal is added is determined by the level variation of the lower range based on the ratio between the long-term envelope value and the short-term envelope value of the lower range signal. Referring to FIGS. 5 and 6, the sections t1-t2 and t3-t4, in which the output value of the first comparator 113 is high, are determined as the beat sections. Accordingly, as shown in FIG. 6, the gain control signal is generated in the section t1-t2 and the section t3-t4, and the output signal is adjusted to have a gain higher by 1 in both sections as compared with the corresponding sections in the input signal shown in FIG. 5.

Also, the gain generator 112, as shown in FIG. 4, may generate a gain control signal having a amplitude corresponding to a ratio between the long-term envelope and the short-term envelope, showing variation in the lower range level received from the signal detector, with respect to the determined beat section. Therefore, looking at FIG. 6, the gain control signal generated at the point of time 'a' has a high level, and the gain control signal at the point of time 'c' has a level lower than that at the point of time 'a'. Because the gain control signal is not generated at the point of time 'b' which is excluded from the beat section, the gain control signal has a amplitude of 0 and thus the gain value becomes 1, thereby performing no gain control.

In the audio signal processing apparatus 100 according to the first exemplary embodiment, a threshold for determining whether to perform the foregoing gain control of the input signal is varied depending on the level variations in the long-term envelope and the short-term envelope of the lower range signal, and the amplitude of the gain may also varied depending on the level variations in the long-term envelope and the short-term envelope of the lower range signal.

Figure 7:
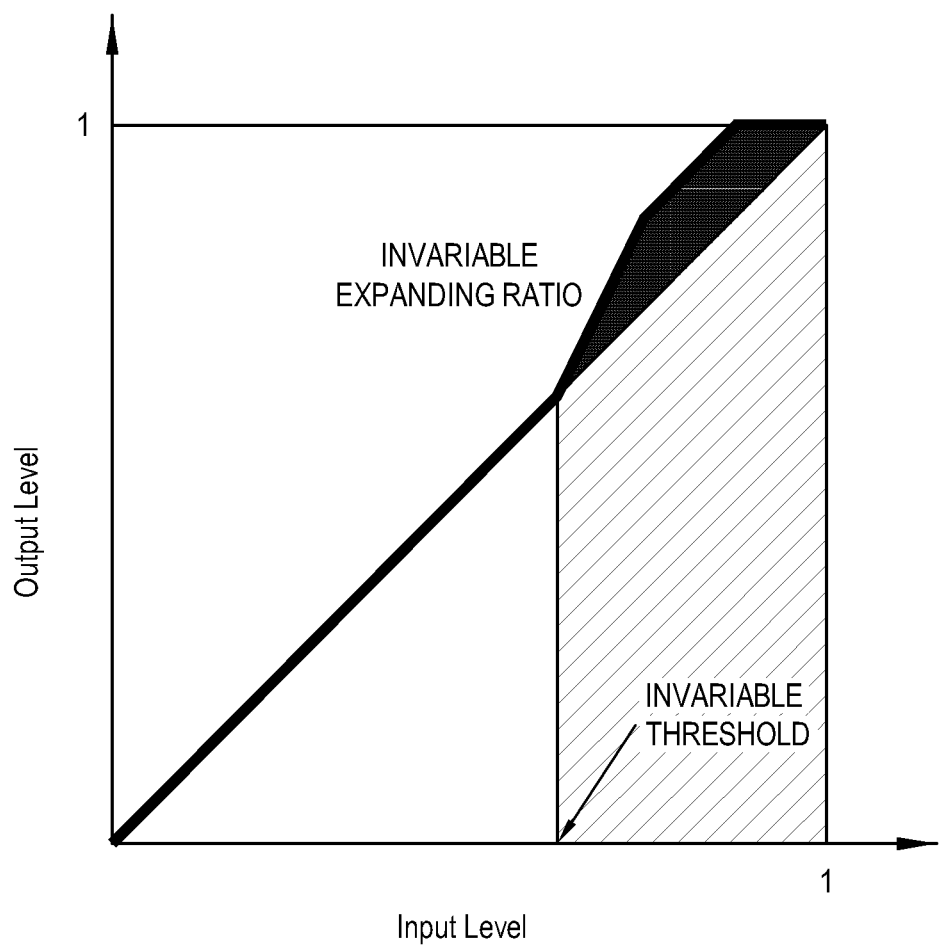
FIG. 7 is a graph showing a correlation between a threshold and a gain control signal in a related art audio signal processing apparatus.
Figure 8:
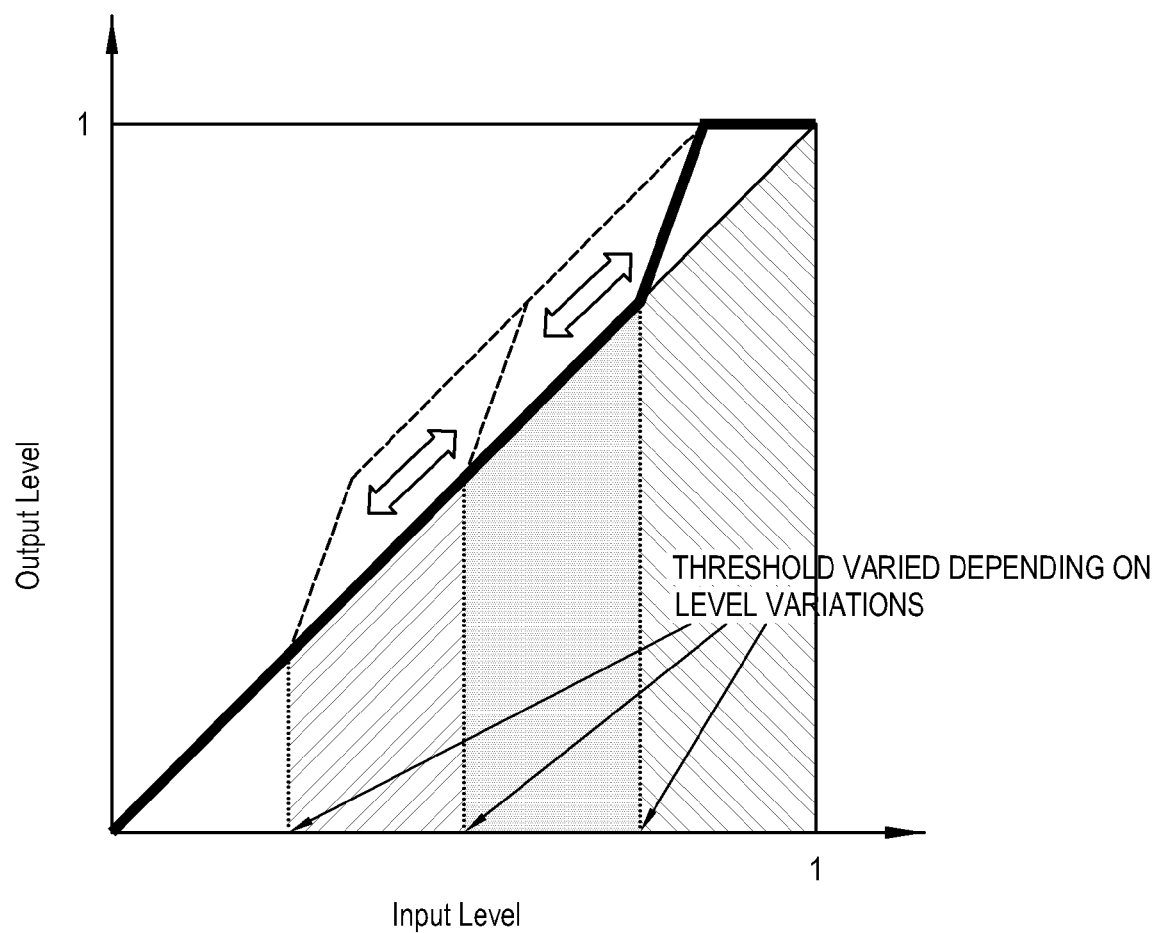
FIG. 8 is a graph showing an example where a threshold is varied in an audio signal processing apparatus according to the first exemplary embodiment.
Figure 9:
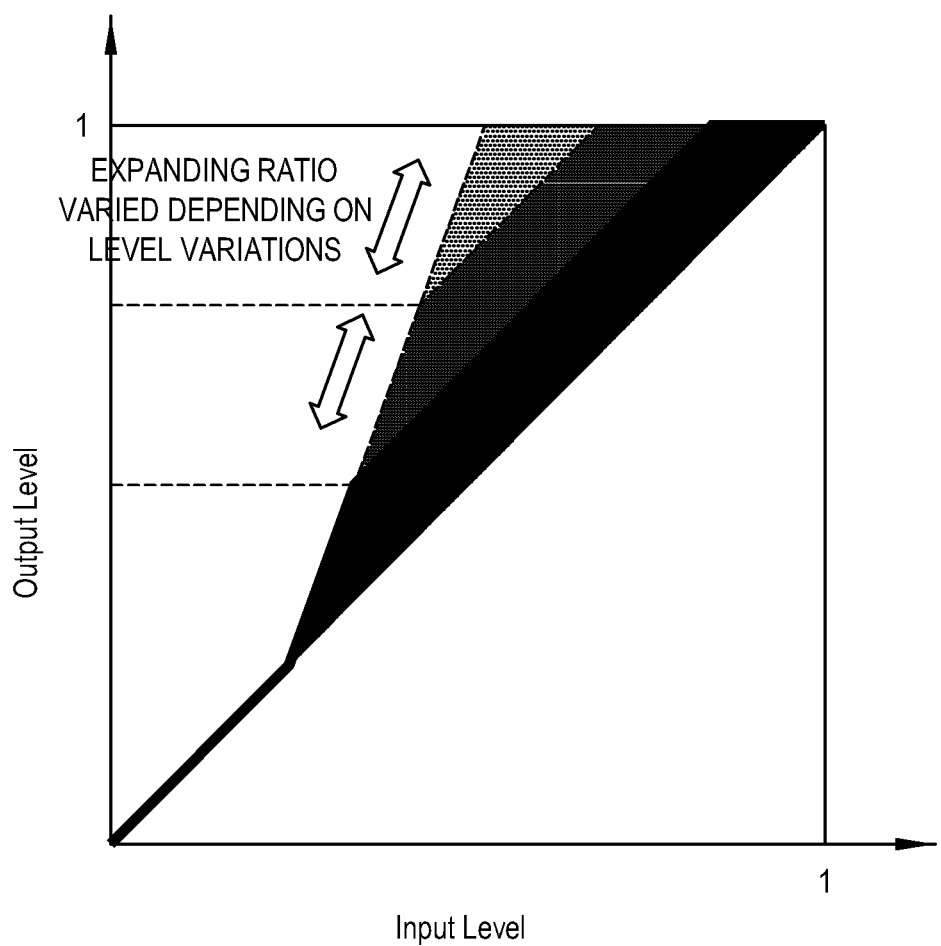
FIG. 9 is a graph showing an example where a gain is varied in an audio signal processing apparatus according to the first exemplary embodiment.

FIG. 7 is a graph showing a correlation between a threshold and a gain control signal in a related art audio signal processing apparatus, FIG. 8 is a graph showing an example where a threshold is varied in an audio signal processing apparatus according to the first exemplary embodiment, and FIG. 9 is a graph showing an example where a gain is varied in an audio signal processing apparatus according to the first exemplary embodiment.

As shown in FIG. 7, the related art audio signal processing apparatus compares the input signal with the invariable threshold, and generates an output signal, the gain of which is controlled in accordance with the invariable expanding ratio, when the input signal is equal to or higher than the corresponding threshold. Therefore, when the input signal is lower than the threshold, the gain control is not performed, and thus an effect on reinforcing the beat due to control of the lower range sound is not expected at all with respect to an audio signal having a small amplitude.

On the other hand, as shown in FIG. 8, in the audio signal processing apparatus 100, the threshold is varied depending on level changes in the lower range signal.

In the audio signal processing apparatus 100 where the threshold is varied as above depending on the level variations in the lower range signal, the gain control is enabled with respect to any level of the input signal. In more detail, when a lower range signal having a high level is input, if the lower range signals having the higher levels than that are input successively, it is determined that the level variation occurs and therefore the gain control signal higher than 1 is generated to thereby expand, i.e., enlarge the output level. Although the lower range signal having a low level is input, if the lower range signals having the higher levels are input successively, it is determined that the level variation occurs and therefore the gain control signal higher than 1 is generated to thereby expand the output level. Accordingly, even through a signal having a lower level than the related art threshold, if the levels of the successively input lower range signals become at least a little higher, it is determined that the level variation occurs and therefore the gain control signal that is higher than 1 is generated to thereby expand the output level.

As shown in FIG. 9, in the audio signal processing apparatus 100 according to the first exemplary embodiment, a gain control amount, i.e., an expanding ratio is varied depending on the level variations of the lower range signal. Specifically, because the expanding ratio is determined based on the amplitude ratio between the long-term envelope and the short-term envelope of the lower range signal, a gain very higher than 1 is generated if the amplitudes of two envelopes are similar to each other, thereby largely expanding the output signal. Also, if there is a difference between two envelopes, a gain a little higher than 1 is generated to thereby make the output relatively a little high.

The first signal multiplexer 122 applies the gain control signal generated by the gain generator 121 to the lower range signal and thus outputs the expanded lower range signal. The output lower range signal is more reinforced in bass beats than the input lower range signal because it undergoes the gain control for expansion in the beat section, thereby allowing a listener to feel a more improved sensation of beating.

Figure 10:
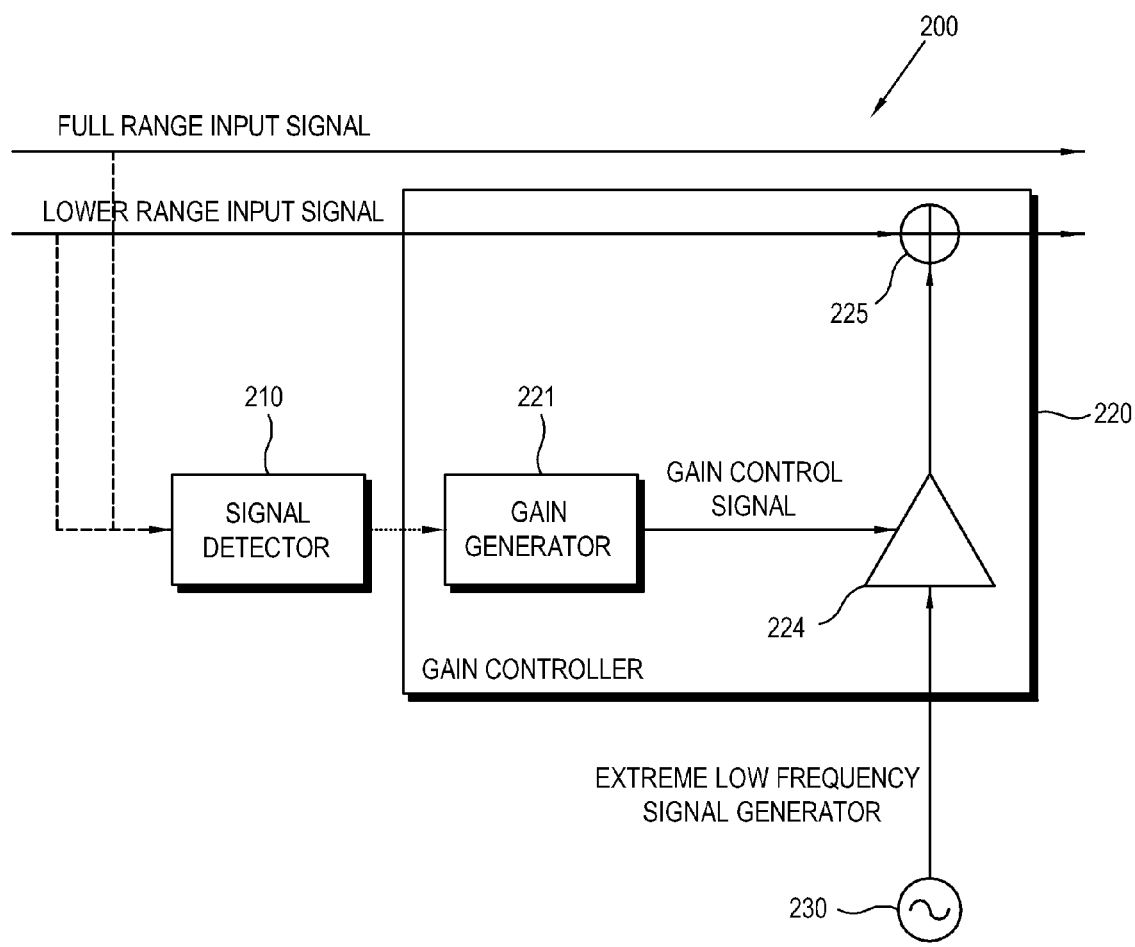
FIG. 10 is a block diagram showing configurations of an audio signal processing apparatus according to a second exemplary embodiment.
Figure 11:
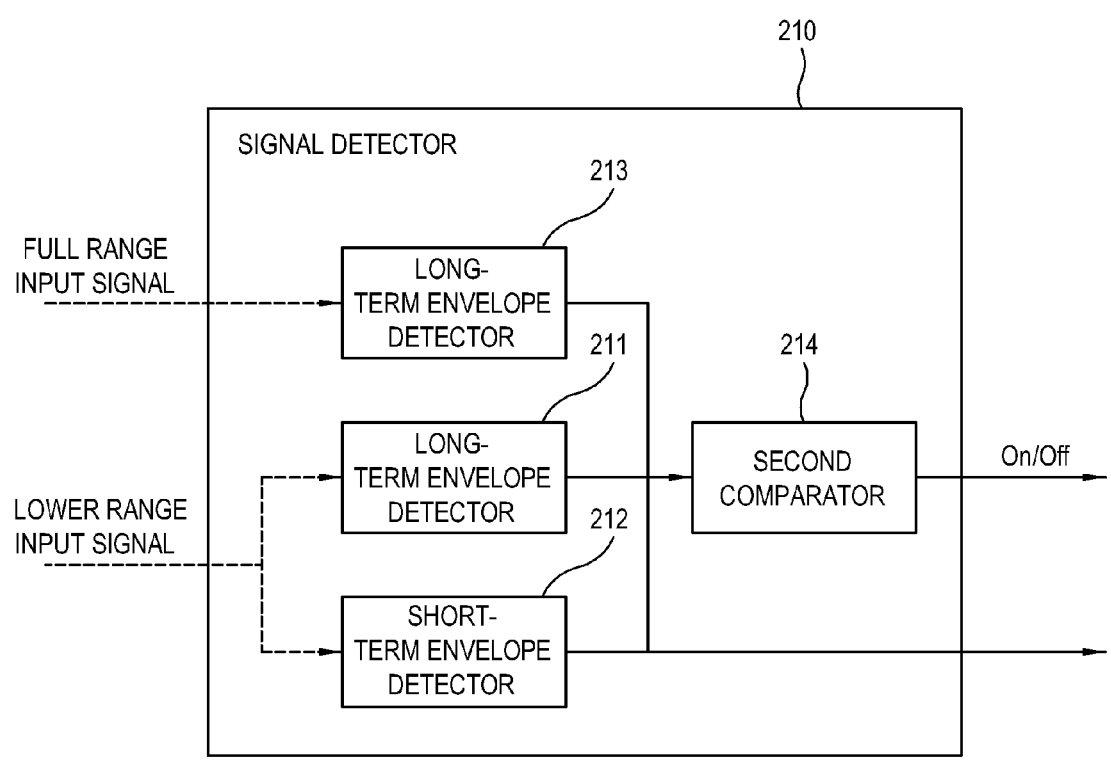
FIG. 11 is a block diagram showing configurations of a signal detector of FIG. 10.
Figure 12:
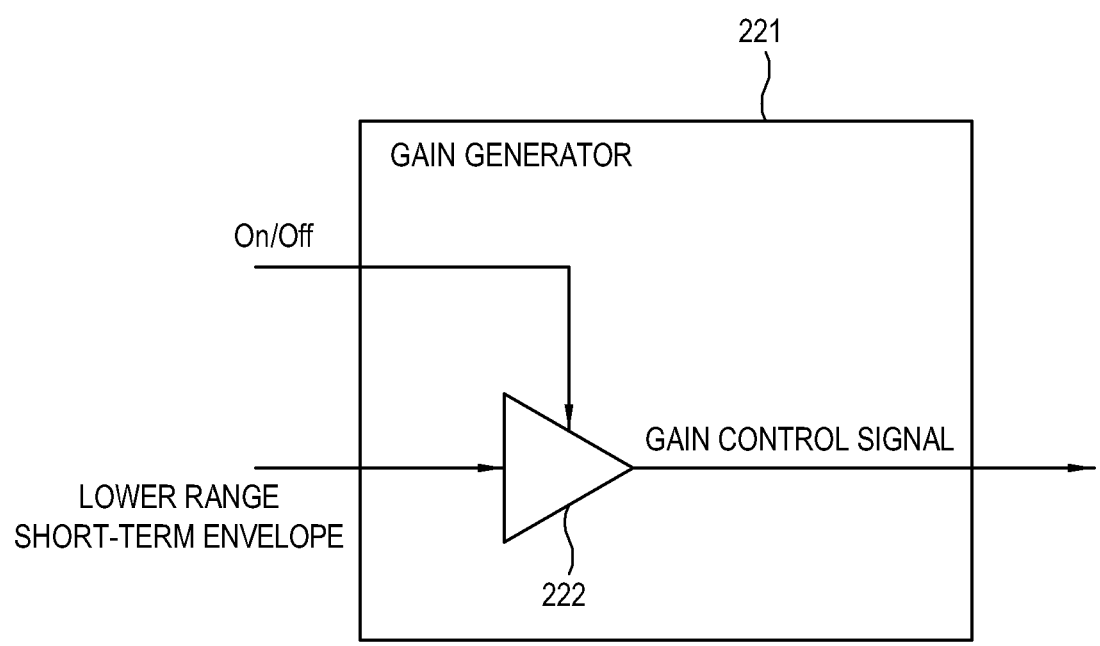
FIG. 12 is a block diagram showing configurations of a gain generator of FIG. 10.

FIG. 10 is a block diagram showing a configuration of the audio signal processing apparatus 200 according to a second exemplary embodiment, FIG. 11 is a block diagram showing a configuration of the signal detector 210 of FIG. 10, and FIG. 12 is a block diagram showing a configuration of the gain generator 221 of FIG. 10.

As compared with the first exemplary embodiment, the second exemplary embodiment is characterized in that the gain control is performed by further detecting the long-term envelope of the full range signal and adding an extreme low frequency signal corresponding to a lower range short-term envelope to an input signal.

As shown in FIG. 10, the audio signal processing apparatus 200, according to the second exemplary embodiment, may include a signal detector 210 for detecting bass beats through the lower range signal and the full range signal of the input signal; a gain controller 220 for controlling the gain of the input signal through the bass beats detected by the signal detector 210; and an extreme low frequency signal generator 230 for generating an extreme low frequency signal. In the second exemplary embodiment shown in FIG. 10, it is illustrated that the signal detector 210 of the audio signal processing apparatus 200 receives the lower range signal and the full range signal, which are previously separated, but not limited thereto. Alternatively, a low pass filter (similar to the LPF 215 as shown in FIG. 16) may be provided for separating the lower range signal from the full range input signal. Embodiments provided with such a low pass filter 215 will be described in more detail with reference to FIGS. 15 and 16.

As shown in FIG. 11, the signal detector 210 includes a long-term envelope detector 211 for detecting a long-term envelope of the lower range signal, a short-term envelope detector 212 for detecting a short-term envelope of a lower range signal, a long-term envelope detector 213 for detecting a long-term envelope of the full range signal, and a second comparator 214 for comparing the long-term envelope and the short-term envelope of the lower range signal with the long-term envelope of the full range signal with respect to amplitude and thus outputting on/off signals to determine the beat section.

Figure 13:
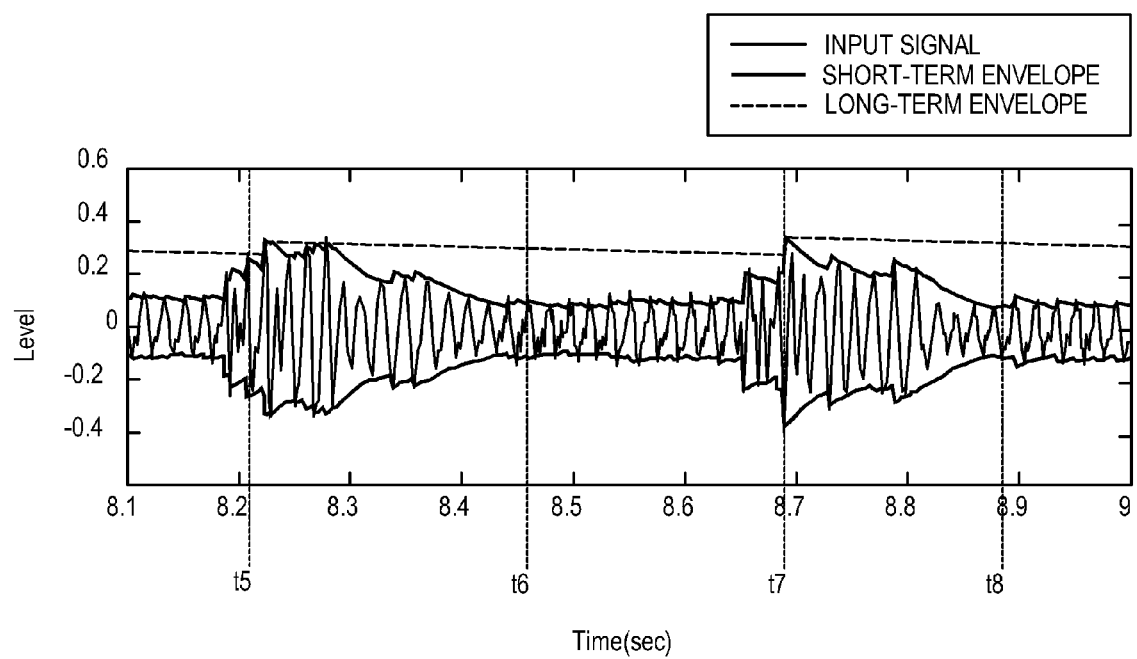
FIGS. 13 and 14 show waveforms of audio signals according to a second exemplary embodiment.
Figure 14:
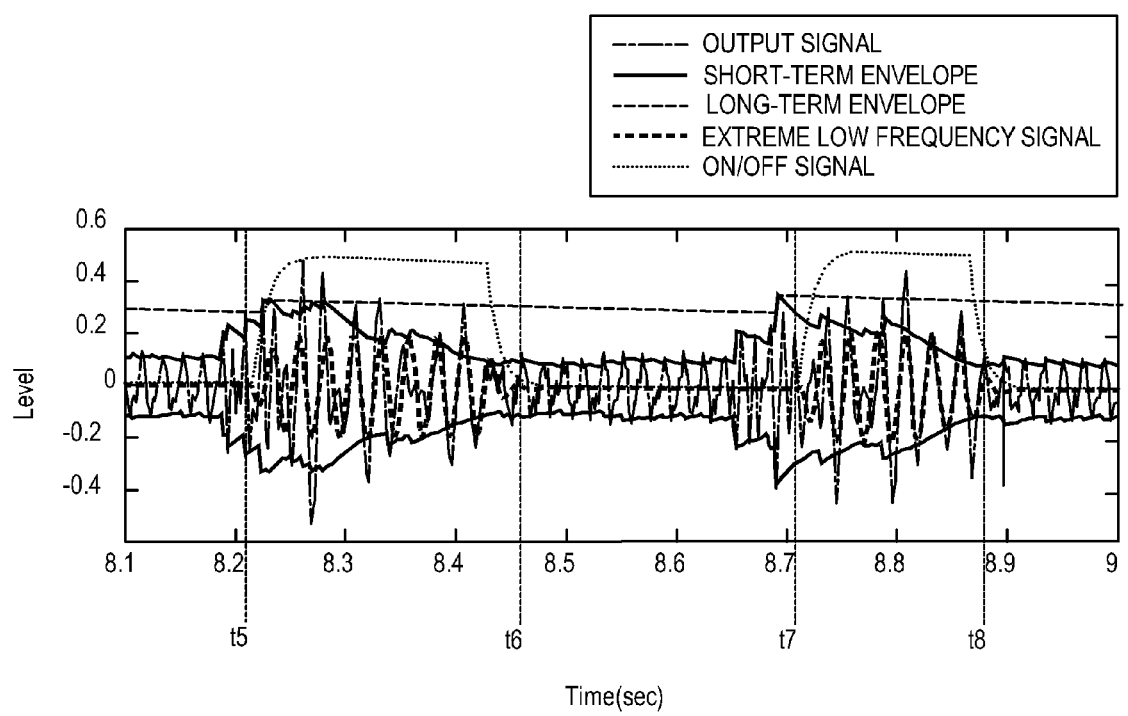

The long-term envelope detector 211 and the short-term envelope detector 212 respectively use an attack section and an release section of the lower range signal to detect the long-term envelope and the short-term envelope. The attack section refers to a section a starting point of sound to a maximum level point of sound, which is shown as a short section in FIGS. 13 and 14. The release section refers to a section where the sound gets smaller and disappears, which is shown as a long section as shown in FIGS. 13 and 14. Further, the long-term envelope detector 213 detects the long-term envelope of the full range signal.

FIGS. 13 and 14 show waveforms of audio signals according to the second exemplary embodiment. FIG. 13 shows respective waveforms of a lower range input signal, and a long-term envelope and a short-term envelope of the lower range signal, and FIG. 14 shows respective waveforms of a lower range output signal, a long-term envelope and a short-term envelope of the lower range signal, an extreme low frequency signal and on/off signals.

The second comparator 214 may compare the long-term envelope and the short-term envelope of the lower range signal with the long-term envelope of the full range signal with respect to amplitude and thus outputs the on/off signals to determine the beat section. Such generated on/off signals are illustrated in FIG. 14.

Specifically, the second comparator 214 outputs the off signal corresponding to no beat section if the amplitude of the short-term envelope of the lower range signal is smaller than a preset ratio of the long-term envelope of the lower range signal. Also, the second comparator 214 outputs the off signal corresponding to no beat section if the amplitude of the long-term envelope of the lower range signal is smaller than a preset ratio of the long-term envelope of the full range signal. Here, the preset ratio refers to a preset threshold, which can be stored in a storage of the audio signal processing apparatus 200.

For example, in FIG. 14, a section t5-t6 and a section t7-t8 are determined as the beat sections in accordance with the on/off signals output from the second comparator 214.

As shown in FIG. 10, the gain controller 220 includes a gain generator 221 for generating a gain control signal based on the on/off signal received from the signal detector 210 and the short-term envelope of the lower range signal; a second signal multiplexer 224 for adding the gain control signal to the extreme low frequency signal received from the extreme low frequency signal generator 230; and a first adder 225 for outputting a lower range output signal expanded by adding the extreme low frequency signal output from the second signal multiplexer 224 to the lower range input signal. In FIG. 10, the output signal of the first adder 225 is the lower range signal, the gain of which is controlled, but not limited thereto. Alternatively, the audio signal processing apparatus 200 may apply the gain control to the full range signal.

The extreme low frequency signal generator 230 generates an extreme low frequency signal having a frequency of 80 Hz or below. In the second exemplary embodiment, the extreme low frequency signal is generated to have a frequency of 40 Hz.

As shown in FIG. 12, the gain generator 221 comprises a third signal multiplexer 222 for combining the on/off signals received from the signal detector 210 and the short-term envelope signal of the lower range signal to thereby generate a gain control signal.

In more detail, referring to FIG. 14, the sections t5-t6 and the section t7-t8, where the on/off signals received from the signal detector 210 are on, are determined as the beat section where beats are generated. The gain generator 221 generates the gain control signal having a positive correlation to correspond to the short-term envelope signal of the lower range signal with respect to the beat sections t5-t6 and t7-t8.

The short-term envelope value of the lower range signal may be transmitted to the gain generator 221 and used in determining the amount of the extreme low frequency signal to add. That is, within the section where the on/off signals among the input signals of the gain generator 221 are on, a short-term envelope amplitude of the lower range signal indicates an amplitude of a bass beat component. Therefore, the amount of the extreme low frequency signal that is added is associated to have positive correlation with the short-term envelope amplitude of the lower range signal. Also, within the section where the on/off signals are off, it is determined that no bass beat component exists, and therefore the amount of the extreme low frequency signal added becomes 0.

The second multiplexer 224 combines a gain control signal generated corresponding to the foregoing amount of the extreme low frequency signal to be added with the extreme low frequency signal received from the extreme low frequency signal generator 230, thereby generating the extreme low frequency signal. Therefore, as shown in FIG. 14, it will be appreciated that the extreme low frequency signal generated by the second multiplexer 224 is generated to have a value excluding 0 within the beat section. Likewise, as compared with the input signal of FIG. 13, the lower range output signal output from the first adder 225 undergoes the expanded gain control within the beat section where the extreme low frequency signal is added as shown in FIG. 14, thereby providing a listener with sound improved in a sensation of lower range feeling.

Figure 15:
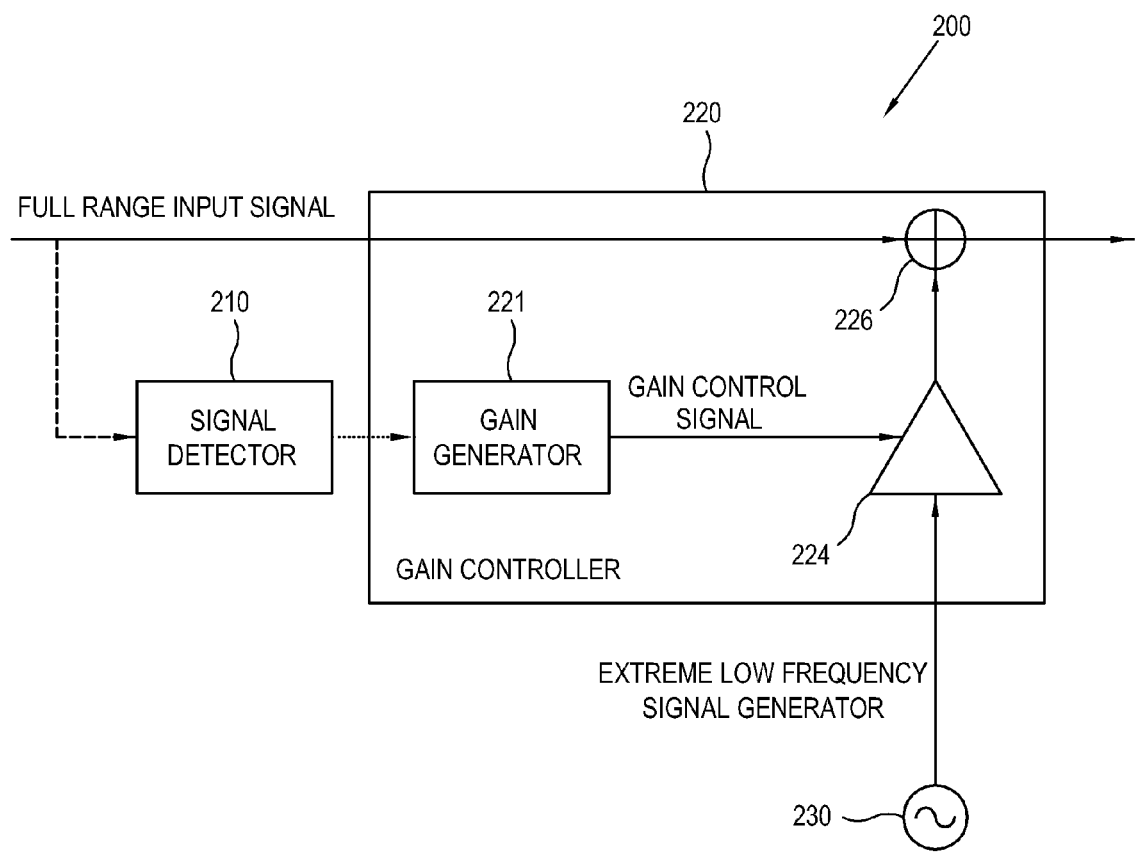
FIG. 15 is a block diagram showing configurations of an audio signal processing apparatus according to a third exemplary embodiment.
Figure 16:
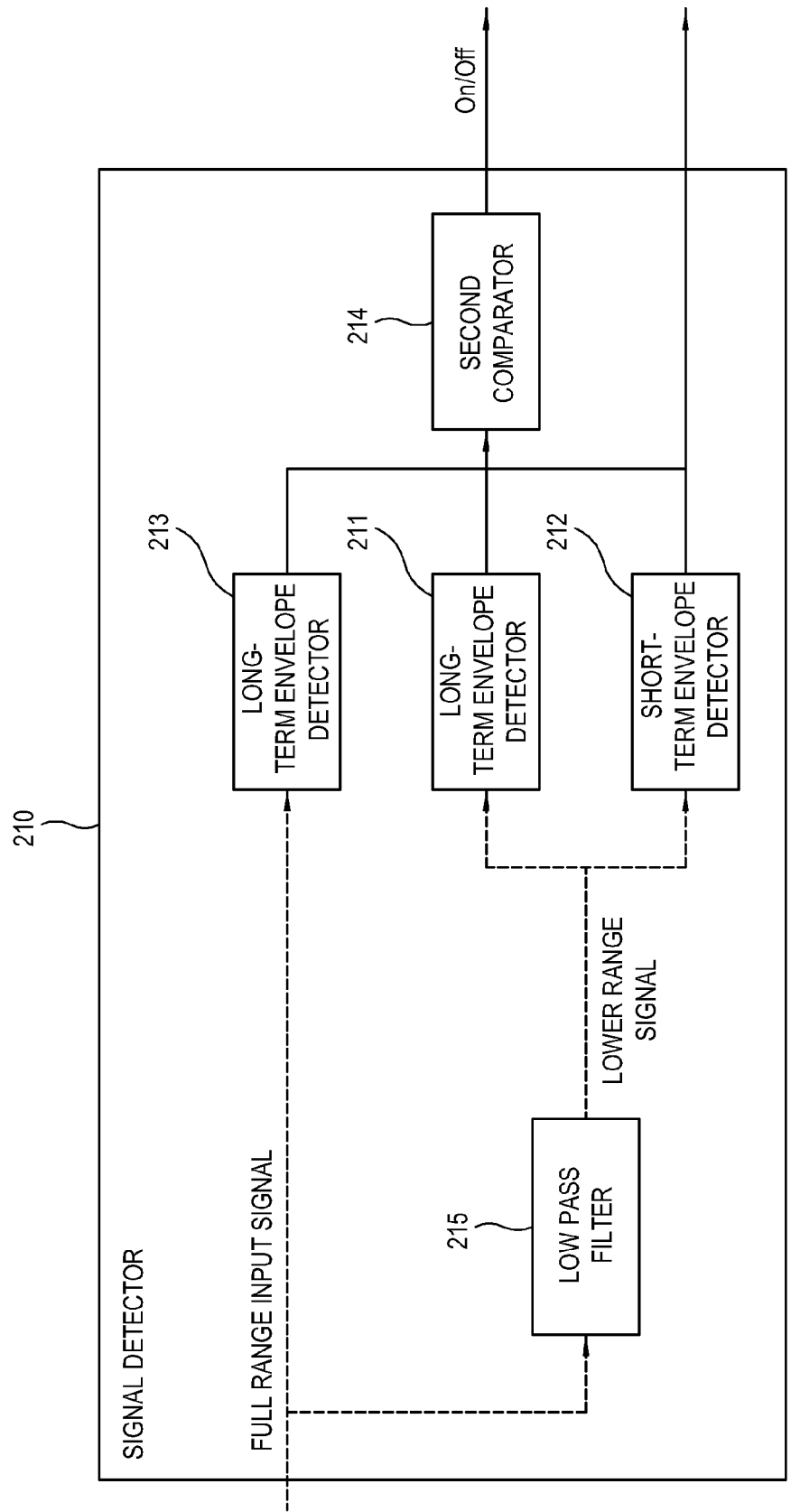
FIG. 16 is a block diagram showing configurations of a signal detector of FIG. 15.

FIG. 15 is a block diagram showing configurations of an audio signal processing apparatus 200 according to a third exemplary embodiment, and FIG. 16 is a block diagram showing configurations of a signal detector 210 of FIG. 15.

As compared with the second exemplary embodiment, the third embodiment is characterized in that a low pass filter 215 is further provided to extract a lower range signal from a full range signal and a second adder is provided for adding an extreme low frequency signal to a full range input signal. Therefore, other elements except the low pass filter 215 and the second adder 226 are referred to by the same numerals and terms as those of the second exemplary embodiment shown in FIGS. 10 to 12, and detailed descriptions will be omitted to avoid repetitive descriptions.

As shown in FIG. 15, the audio signal processing apparatus 200, according to the third exemplary embodiment, may include a signal detector 210 for detecting a bass beat from the full range input signal; a gain controller 220 for controlling the gain of the input signal through the bass beat detected by the signal detector 210; and an extreme low frequency signal generator 230 for generating an extreme low frequency signal.

As shown in FIG. 16, the signal detector 210 may include a low pass filter (LPF) 215 for separating the lower range signal from the full range input signal; a long-term envelope detector 211 for detecting a long-term envelope of the lower range signal received from the low pass filter 215; a short-term envelope detector 212 for detecting a short-term envelope of the lower range signal; a long-term envelope detector 213 for detecting a long-term envelope of the full range signal; and a second comparator 214 for comparing the long-term envelope and the short-term envelope of the lower range signal with the long-term envelope of the full range signal and thus outputting on/off signals to determine the beat section.

FIG. 16 shows an example where the low pass filter 215 is included in the signal detector 210, but is not limited thereto. Alternatively, the low pass filter may be provided separately from the audio signal processing apparatus 100.

As shown in FIG. 15, the gain controller 220 includes a gain generator 221 for generating a gain control signal based on the short-term envelope of the lower range signal and the on/off signals received from the signal detector 210; a second multiplexer 224 for adding the gain control signal to the extreme low frequency signal received from the extreme low frequency signal generator 230; a second adder 226 for adding the extreme low frequency signal of the second multiplexer 224 to the full range signal and outputting the expanded output signal. FIG. 15 illustrates an example where the second adder 226 outputs the full range signal to which the gain control is applied, but not limited thereto. Alternatively, the audio signal processing apparatus 200 may apply the gain control to the lower range signal received from the low pass filter 215.

The extreme low frequency signal generator 230 generates the extreme low frequency signal equal to or lower than 80 Hz. In the third exemplary embodiment, the extreme low frequency signal of 40 Hz is generated.

As shown in FIG. 12, the gain generator 221 includes a third signal multiplexer 222 that combines the on/off signals received from the signal detector 210 with the short-term envelope signal of the lower range signal and generates the gain control signal.

The second multiplexer 224 generates the extreme low frequency signal where the gain control signal generated corresponding to the amount of adding the extreme low frequency signal and the extreme low frequency signal received from the extreme low frequency signal generator 230 are combined. Thus, the extreme low frequency signal generated by the second multiplexer 224 has a value excluding 0 in the beat section as shown in FIG. 14, and likewise, as compared with the input signal of FIG. 13, the lower range output signal output from the second adder 226 undergoes the expanded gain control in the beat section where the extreme low frequency signal is added. Thus, a listener can feel the sound reinforced with the sensation of the lower range.

Below, an audio signal processing method in this exemplary embodiment will be described with reference to FIGS. 17 and 18.

Figure 17:
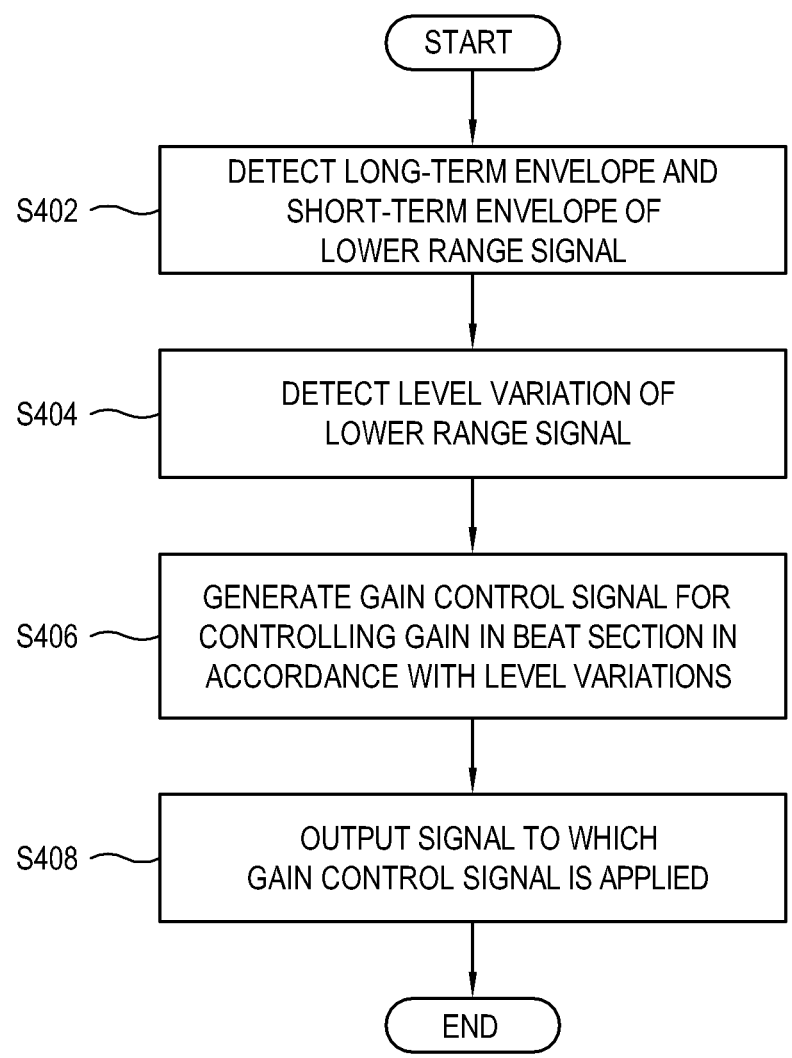
FIG. 17 is a flowchart showing an audio signal processing procedure according to the first exemplary embodiment.

FIG. 17 is a flowchart showing an audio signal processing procedure according to the first exemplary embodiment.

As shown in FIG. 17, the signal detector 110 of the audio signal processing apparatus 100 detects the long-term envelope and the short-term envelope of the lower range signal (S402). Here, the signal detector 110 may use the attack and release sections of the lower range signal to detect the long-term envelope and the short-term envelope through the long-term envelope detector 111 and the short-term envelope detector 112, respectively. The operation S402 may further include separating the lower range signal from the input signal (i.e., the full range signal).

The first comparator 113 of the signal detector 110 outputs the level variation in the lower range signal in accordance with the amplitude ratios between the long-term and short-term envelopes detected at the operation S402 (S404). Here, the output level variation is determined based on the amplitude ratio between the long-term envelope and the short-term envelope detected at the operation S402, and the threshold of determining whether to perform the gain control is varied depending on the level variation.

The gain generator 121 of the gain controller 120 receives the level variations output at the operation S402, and generates the gain control signal for controlling the gain of the beat section based on the received level variation (S406). Here, a section, in which the gain control is performed, is called a beat section. If there is a section where a level ratio between the long-term envelope and the short-term envelope of the lower range signal becomes larger, this section is determined as the beat section where beats are generated.

The gain controller 120 outputs the input signal or the lower range signal, to which the gain control signal generated in the operation S406 is applied (S408).

Thus, in the audio signal processing apparatus 100 according to the first exemplary embodiment, the gain of the beat section is controlled by the gain control signal generated in the operation S406, and the gain is controlled to become larger if the level difference between the long-term envelope and the short-term envelope of the lower range signal is small.

Figure 18:
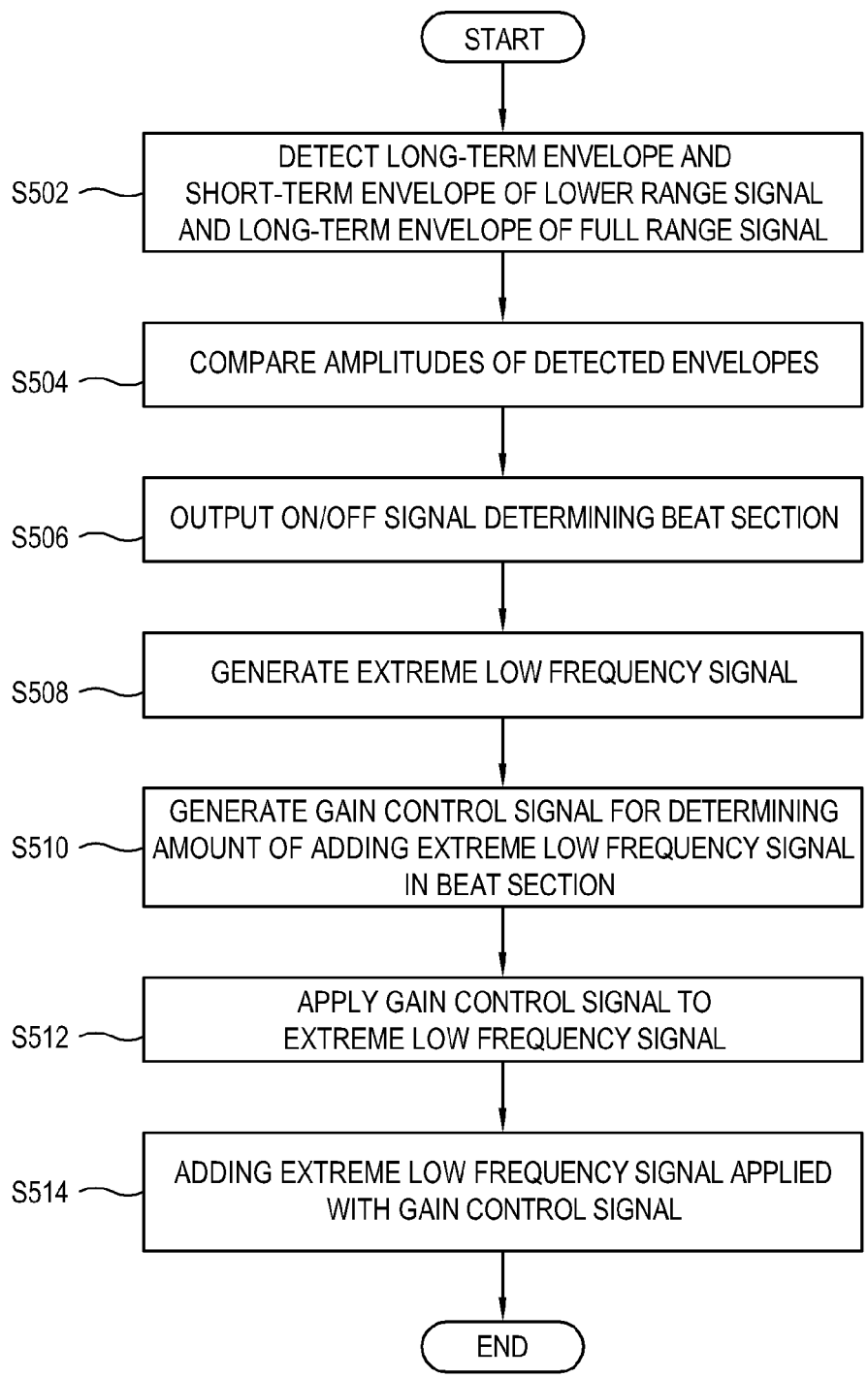
FIG. 18 is a flowchart showing an audio signal processing procedure according to second or third exemplary embodiments.

FIG. 18 is a flowchart showing an audio signal processing procedure according to second or third exemplary embodiments.

As shown in FIG. 18, the signal detector 210 of the audio signal processing apparatus 200 detects the long-term envelope and the short-term envelope of the lower range signal and the long-term envelope of the full range signal (S502). Here, the signal detector 210 uses the attack and releases sections of the lower range signal to respectively detect the long-term envelope and the short-term envelope of the lower range signal through the long-term envelope detector 211 and the short-term envelope detector 212, and uses the attack and releases sections of the full range signal to detect the long-term envelope of the full range signal through the long-term envelope detector 213. The operation S502 may further include separating the lower range signal from the input signal (e.g., the full range signal).

The second comparator 214 of the signal detector 210 compares the long-term envelope and the short-term envelope of the lower range signal with the long-term envelope of the full range signal detected in the operation S502 with respect to the amplitude (S504).

Further, the second comparator 214 outputs the on/off signals of the determined beat section based on the comparison results in the operation S504 (S506). Based on the output signals of the second comparator 214, the off signal corresponding to no beat section is output if the amplitude of the short-term envelope of the lower range signal is smaller than the preset ratio of the amplitude of the long-term envelope of the lower range signal, and the off signal corresponding to no beat section is output if the amplitude of the long-term envelope of the lower range signal is smaller than the preset ratio of the amplitude of the long-term envelope of the full range signal.

The extreme low frequency signal generator 230 may generate a predetermined extreme low frequency signal (e.g., 40 Hz) (S509).

The gain generator 221 of the gain controller 220 generates the gain control signal for determining the amount of the extreme low frequency signal that should be added with regard to the beat section determined in the operation S506 (S510). Here, the amount of the extreme low frequency signal to add corresponds to the short-term envelope value of the lower range signal detected in the operation S502, and has a positive correlation with the bass beat.

The gain controller 220 applies the gain control signal generated in the operation S510 to the extreme low frequency signal generated in the operation S509 (S512).

Further, the gain controller 220 adds the extreme low frequency signal output in the operation S512 to the input signal or the lower range signal (S514).

Thus, in the audio signal processing apparatus 200 according to the second and third exemplary embodiments, the gain of the beat section is controlled by adding the extreme low frequency signal to which the gain control signal generated in the operation S510 is applied, and the gain of adding the extreme low frequency signal is controlled to correspond to the short-term envelope of the lower range signal.

Thus, according to the first exemplary embodiment, the beat section is detected in accordance with the level variations in the lower range signal, and the expansion ratio for the gain control is adjusted in accordance with the characteristics of the lower range signal, so that dynamic characteristics of bass can be reinforced with regard to completely mixed content, thereby providing a listener with output sound having an improved rhythmical sense.

Also, according to the second and third exemplary embodiments, the extreme low frequency signal may be added to the detected beat section of the input signal, and the amount of the extreme low frequency signal that may be added is automatically controlled in accordance with the characteristics of the lower range signal, thereby outputting the sound reinforced with a sensation of lower range feeling without any separate operation of a listener with respect to the completely mixed content.

Although a few exemplary embodiments have been shown and described, it will be appreciated by those skilled in the art that changes may be made in these exemplary embodiments without departing from the principles and spirit of the inventive concept, the scope of which is defined in the appended claims and their equivalents.

What is claimed is:

1. An audio signal processing apparatus comprising:
a signal detector configured to detect a long-term envelope and a short-term envelope of a lower range signal of an audio input signal,
a controller configured to control a gain in a beat section of the audio input signal, and
outputting a gain adjusted audio signal via a loudspeaker, wherein the beat section is determined based on the detected long-term envelope and the short-term envelope of the lower range signal.

2. The audio signal processing apparatus according to claim 1, wherein the signal detector is further configured to use attack and release sections of the lower range signal to detect the long-term envelope and the short-term envelope of the lower range signal.

3. The audio signal processing apparatus according to claim 1, wherein the signal detector comprises a first comparator configured to output a level variation of the lower range signal based on an amplitude ratio between the long-term envelope and the short-term envelope of the lower range signal.

4. The audio signal processing apparatus according to claim 3, wherein the gain controller is further configured to control the gain of the beat section in accordance with the amplitude ratio, based on the received level variation.

5. The audio signal processing apparatus according to claim 4, wherein the gain controller is further configured to generate a gain control signal so that the gain becomes larger as difference in level between the long-term envelope and the short-term envelope of the lower range signal decreases.

6. The audio signal processing apparatus according to claim 5, wherein the gain controller is further configured to apply the gain control signal to at least one of the input signal and the lower range signal.

7. The audio signal processing apparatus according to claim 3, wherein a threshold for determining whether to control the gain of the input signal is varied based on the level variation.

8. The audio signal processing apparatus according to claim 1, wherein the signal detector is further configured to detect a long-term envelope of a full range signal of the input signal.

9. The audio signal processing apparatus according to claim 8,
wherein the gain controller is further configured to control the gain of the beat section by adding an extreme low frequency signal to the beat section of the input signal, and
wherein the extreme low frequency signal corresponds to a short-term envelope value of the lower range signal.

10. The audio signal processing apparatus according to claim 8, further comprising:
an extreme low frequency signal generator configured to generate an extreme low frequency signal,
wherein the gain controller is configured to generate a gain control signal for determining an amount of the extreme low frequency signal to add to the beat section to correspond to the short-term envelope value of the lower range signal, and add the gain control signal and the generated extreme low frequency signal together.

11. The audio signal processing apparatus according to claim 10, wherein the gain controller is further configured to add the added extreme low frequency signal and the gain control signal to at least one of the input signal and the lower range signal.

12. The audio signal processing apparatus according to claim 8, wherein the signal detector comprises a second comparator that is configured to compare the long-term envelope and the short-term envelope of the lower range signal with the long-term envelope of the full range signal with respect to amplitude, and output on/off signals to determine the beat section.

13. The audio signal processing apparatus according to claim 12, wherein the gain controller is configured to determine that a section is the beat section if an amplitude ratio between the short-term envelope and the long-term envelope of the lower range signal is larger than or equal to a preset ratio, in accordance with an output signal of the second comparator.

14. The audio signal processing apparatus according to claim 12, wherein the gain controller is configured to determine that a section is the beat section if an amplitude of the long-term envelope of the lower range signal is larger than or equal to a preset ratio, in accordance with an output signal of the second comparator.

15. The audio signal processing apparatus according to claim 1, further comprising a low pass filter configured to separate out the lower range signal from a full range input signal.

16. An audio signal processing method comprising:
detecting a long-term envelope and a short-term envelope of a lower range signal of an audio input signal;
controlling a gain in a beat section of the audio input signal determined based on the detected long-term envelope and the short-term envelope of the lower range signal; and
outputting a gain adjusted audio signal via a loudspeaker.

17. The audio signal processing method according to claim 16, wherein the detecting comprises using attack and release sections of the lower range signal to detect the long-term envelope and the short-term envelope of the lower range signal.

18. The audio signal processing method according to claim 16, further comprising outputting a level variation of the lower range signal based on an amplitude ratio between the long-term envelope and the short-term envelope of the lower range signal.

19. The audio signal processing method according to claim 18, wherein the controlling the gain comprises controlling the gain of the beat section in accordance with the amplitude ratio, based on the received level variation.

20. The audio signal processing method according to claim 19, wherein the controlling the gain comprises generating a gain control signal so that the gain becomes larger as difference in level between the long-term envelope and the short-term envelope of the lower range signal decreases.

21. The audio signal processing method according to claim 20, further comprising applying the gain control signal to at least one of the input signal and the lower range signal.

22. The audio signal processing method according to claim 18, wherein a threshold for determining whether to control the gain of the input signal is varied based on the level variation.

23. The audio signal processing method according to claim 16, further comprising detecting a long-term envelope of a full range signal of the input signal.

24. The audio signal processing method according to claim 23,
wherein the controlling the gain comprises controlling the gain of the beat section by adding an extreme low frequency signal to the beat section of the input signal, and
wherein the extreme low frequency signal corresponds to a short-term envelope value of the lower range signal.

25. The audio signal processing method according to claim 23, further comprising generating an extreme low frequency signal,
wherein the controlling the gain comprises generating a gain control signal for determining an amount of the extreme low frequency signal to add to the beat section to correspond to the short-term envelope value of the lower range signal, and adding the gain control signal and the generated extreme low frequency signal together.

26. The audio signal processing method according to claim 25, further comprising adding the added extreme low frequency signal and the gain control signal to at least one of the input signal and the lower range signal.

27. The audio signal processing method according to claim 23, further comprising comparing the long-term envelope and the short-term envelope of the lower range signal with the long-term envelope of the full range signal with respect to amplitude; and outputting on/off signals to determine the beat section.

28. The audio signal processing method according to claim 27, further comprising determining that a section is the beat section if an amplitude ratio between the short-term envelope and the long-term envelop of the lower range signal is larger than or equal to a preset ratio, in accordance with an output signal of the comparator.

29. The audio signal processing method according to claim 27, further comprising determining that a section is the beat section if an amplitude of the long-term envelope of the lower range signal is larger than or equal to a preset ratio, in accordance with an output signal of the comparator.

30. The audio signal processing method according to claim 16, further comprising separating out the lower range signal through a low pass filter.

31. A method of processing an audio signal, the method comprising:
- separating out a lower range signal from a full range audio input signal;
- detecting a long term envelope and a short term envelope in the lower range signal;
- generating a ratio between the short term envelope and the long term envelope;
- determine a beat section of the lower range signal based on the ratio;
- generating a gain control signal and a low frequency signal; and
- adding the low frequency signal to the beat section based on the gain control signal; and
- outputting a gain adjusted audio signal via a loudspeaker.

* * * * *